US012679083B2

(12) United States Patent
Dai et al.

(10) Patent No.: US 12,679,083 B2
(45) Date of Patent: Jul. 14, 2026

(54) PEELING SYSTEM AND PEELING METHOD FOR FLEXIBLE FINGERPRINT COMPONENT

(71) Applicants:Beijing BOE Sensor Technology Co., Ltd., Beijing (CN); BOE Technology Group Co., Ltd., Beijing (CN)

(72) Inventors: Yi Dai, Beijing (CN); Cheng Li, Beijing (CN); Yue Geng, Beijing (CN); Kuiyuan Wang, Beijing (CN); Chaoyang Qi, Beijing (CN); Zefei Li, Beijing (CN); Yajie Feng, Beijing (CN); Xiaoguan Li, Beijing (CN); Zhonghuan Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 277 days.

(21) Appl. No.: 18/273,770

(22) PCT Filed: Feb. 23, 2021

(86) PCT No.: PCT/CN2021/077505
§ 371 (c)(1),
(2) Date: Jul. 23, 2023

(87) PCT Pub. No.: WO2022/178677
PCT Pub. Date: Sep. 1, 2022

(65) Prior Publication Data
US 2024/0075732 A1 Mar. 7, 2024

(51) Int. Cl.
*B32B 43/00* (2006.01)
*H10P 72/00* (2026.01)

(52) U.S. Cl.
CPC ........ *B32B 43/006* (2013.01); *H10P 72/0442* (2026.01); *Y10T 156/1132* (2015.01);
(Continued)

(58) Field of Classification Search
CPC ............. B32B 43/006; Y10T 156/1132; Y10T 156/1168; Y10T 156/1944; Y10T 156/1978
See application file for complete search history.

(56) References Cited

U.S. PATENT DOCUMENTS

| | | | | |
|---|---|---|---|---|
| 4,828,640 A | * | 5/1989 | Kaya | G03F 1/64 430/4 |
| 6,227,276 B1 | * | 5/2001 | Kim | B29C 63/0013 156/247 |

(Continued)

FOREIGN PATENT DOCUMENTS

| | | |
|---|---|---|
| CN | 108257913 A | 7/2018 |
| CN | 108962914 A | 12/2018 |

(Continued)

OTHER PUBLICATIONS

PCT/CN2021/077505 international search report.

*Primary Examiner* — Philip C Tucker
*Assistant Examiner* — Nickolas R Harm
(74) *Attorney, Agent, or Firm* — IPro, PLLC

(57) ABSTRACT

In a peeling system and a peeling method for a flexible fingerprint component provided by the present invention, the flexible fingerprint component is formed on a rigid substrate, and the flexible fingerprint component comprises a flexible substrate, a photosensitive device layer and an optical film sequentially arranged on the flexible substrate, a first chip-on film bonded to the photosensitive device layer on a first side of the optical film, and a second chip-on film bonded to the photosensitive device layer on a second side of the optical film, wherein the optical film is provided with an extension portion beyond the flexible substrate, the second side of the optical film is located on a side opposite to the (Continued)

extension portion, and the first side of the optical film is located on a side adjacent to the extension portion.

12 Claims, 6 Drawing Sheets

(52) U.S. Cl.
CPC .... *Y10T 156/1168* (2015.01); *Y10T 156/1944* (2015.01); *Y10T 156/1978* (2015.01)

(56) References Cited

U.S. PATENT DOCUMENTS

| | | | | |
|---|---|---|---|---|
| 2002/0094760 | A1* | 7/2002 | Lim | B29C 63/0013 451/41 |
| 2011/0318906 | A1 | 12/2011 | Chida et al. | |
| 2013/0133178 | A1* | 5/2013 | Lu | G02F 1/1303 29/762 |
| 2014/0174041 | A1* | 6/2014 | Monti | B65B 69/0033 53/492 |
| 2015/0319893 | A1* | 11/2015 | Ohno | B32B 38/10 156/707 |
| 2016/0176181 | A1* | 6/2016 | Kim | B32B 38/10 156/701 |
| 2017/0158449 | A1* | 6/2017 | Kramer | B32B 43/006 |
| 2017/0210115 | A1* | 7/2017 | Ohno | H10D 86/423 |
| 2018/0337196 | A1 | 11/2018 | Yang | |
| 2021/0237422 | A1* | 8/2021 | Hao | B32B 43/006 |
| 2022/0344208 | A1 | 10/2022 | Wang | |

FOREIGN PATENT DOCUMENTS

| | | |
|---|---|---|
| CN | 109755420 A | 5/2019 |
| CN | 111613555 A | 9/2020 |
| WO | 2019010607 A1 | 1/2019 |

* cited by examiner

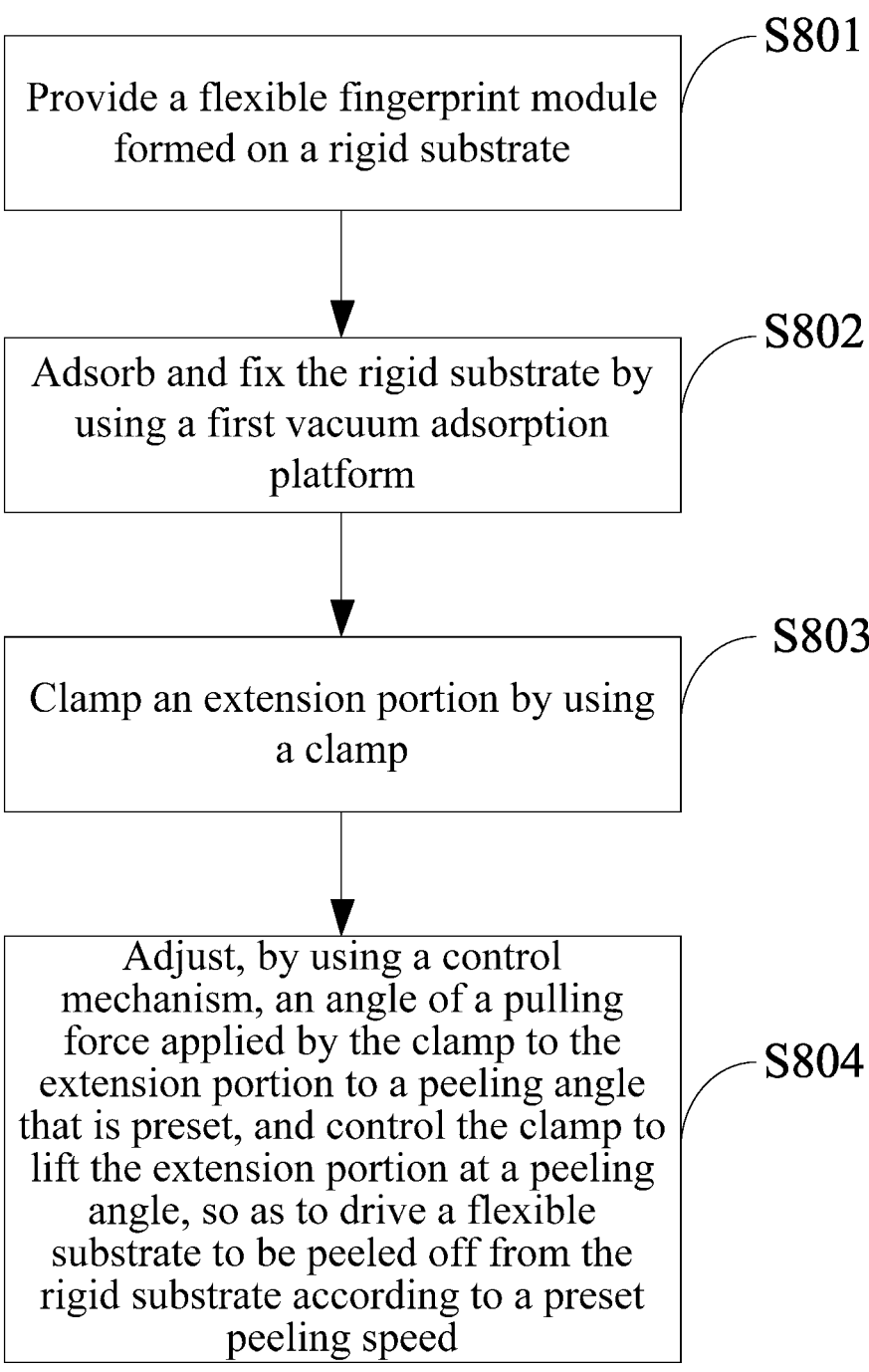

Provide a flexible fingerprint module formed on a rigid substrate

S801

Adsorb and fix the rigid substrate by using a first vacuum adsorption platform

S802

Clamp an extension portion by using a clamp

S803

Adjust, by using a control mechanism, an angle of a pulling force applied by the clamp to the extension portion to a peeling angle that is preset, and control the clamp to lift the extension portion at a peeling angle, so as to drive a flexible substrate to be peeled off from the rigid substrate according to a preset peeling speed

PEELING SYSTEM AND PEELING METHOD FOR FLEXIBLE FINGERPRINT COMPONENT

The present application is a National Stage of International Application No. PCT/CN2021/077505, filed on Feb. 23, 2021, the entire contents of which are incorporated herein by reference.

TECHNICAL FIELD

The present disclosure relates to the technical field of fingerprint recognition, in particular to a peeling system and a peeling method for a flexible fingerprint component.

BACKGROUND

Various flexible electronic devices (such as a flexible displayer, and a flexible sensor) prepared based on a flexible base plate gradually enter the commercial field. The flexible electronic devices have advantages of being bendable and lightweight, and will become a mainstream form in the future.

SUMMARY

Embodiments of the present disclosure provide a peeling system and a peeling method for a flexible fingerprint component. The specific solution is as follows.

In an aspect, an embodiment of the present disclosure provides a peeling system for a flexible fingerprint component. The flexible fingerprint component is formed on a rigid substrate, the flexible fingerprint component includes a flexible substrate, a photosensitive device layer and an optical film sequentially on the flexible substrate, a first chip-on film, on a first side of the optical film, bonded to the photosensitive device layer, and a second chip-on film, on a second side of the optical film. bonded to the photosensitive device layer, the optical film is provided with an extension portion beyond the flexible substrate, the second side of the optical film is on a side opposite to the extension portion, and the first side of the optical film is on a side adjacent to the extension portion; the peeling system includes: a first vacuum adsorption platform, configured to adsorb and fix the rigid substrate; a clamp, configured to clamp the extension portion; and a control mechanism, configured to adjust an angle of a pulling force applied by the clamp to the extension portion to a peeling angle that is preset, and control the clamp to lift the extension portion at the peeling angle, so as to drive the flexible substrate to be peeled off from the rigid substrate according to a preset peeling speed.

Optionally, in the above peeling system provided by the embodiment of the present disclosure, the clamp includes a first clamping plate and a second clamping plate, the control mechanism includes a first rotating shaft, a second rotating shaft, a first manipulator and a second manipulator, the first clamping plate is connected with the first manipulator through the first rotating shaft, and the second clamping plate is connected with the second manipulator through the second rotating shaft.

Optionally, in the above peeling system provided by the embodiment of the present disclosure, sizes of the first clamping plate and the second clamping plate are both substantially the same as a size of the extension portion.

Optionally, the above peeling system provided by the embodiment of the present disclosure further includes: an auxiliary peeling mechanism; the auxiliary peeling mechanism is configured to perform auxiliary peeling on the first chip-on film in a peeling direction at the peeling speed when peeling the flexible fingerprint component to a bonding zone of the first chip-on film.

Optionally, in the above peeling system provided by the embodiment of the present disclosure, the auxiliary peeling mechanism includes: a rigid cushion block and a driver connected with the rigid cushion block.

Optionally, in the above peeling system provided by the embodiment of the present disclosure, the rigid cushion block is a wedge-shaped cushion block, an included angle between the wedge-shaped cushion block and the rigid substrate is less than the peeling angle, and a length of a side parallel to the rigid substrate in a surface contained by the wedge-shaped cushion block and forming the included angle with the rigid substrate is equal to a bonding width of the first chip-on film perpendicular to the peeling direction.

Optionally, the above peeling system provided by the embodiment of the present disclosure further includes: a first transmission mechanism, configured to place the rigid substrate bearing the flexible fingerprint component onto the first vacuum adsorption platform in an aligning mode.

Optionally, the above peeling system provided by the embodiment of the present disclosure further includes: a second transmission mechanism and a second vacuum adsorption platform, wherein the second transmission mechanism is configured to place the flexible fingerprint component on the second vacuum adsorption platform in an aligning mode, so as to adsorb and fix the flexible substrate through the second vacuum adsorption platform; and a vacuum adsorption hole of the second vacuum adsorption platform is smaller than a vacuum adsorption hole of the first vacuum adsorption platform.

Optionally, in the above peeling system provided by the embodiment of the present disclosure, the first transmission mechanism and the second transmission mechanism are each a transmission belt or a manipulator.

Optionally, the above peeling system provided by the embodiment of the present disclosure further includes: a cutting mechanism, configured to cut off the extension portion of the flexible fingerprint component on the second vacuum adsorption platform.

Optionally, the above peeling system provided by the embodiment of the present disclosure further includes: an attaching mechanism, configured to attach a protecting film and a supporting film respectively to the flexible fingerprint component the extension portion of which is cut off, wherein the protecting film is on a side of the optical film facing away from the photosensitive device layer, the supporting film is on a side of the flexible substrate facing away from the photosensitive device layer, and sizes of the protecting film and the supporting film are both substantially the same as a size of the flexible substrate.

Optionally, the above peeling system provided by the embodiment of the present disclosure further includes an ionizing air blower, configured to blow air to remove static electricity between the flexible substrate and the rigid substrate in a peeling process.

In the other aspect, an embodiment of the present disclosure provides a peeling method for a flexible fingerprint component, including: providing a flexible fingerprint component formed on a rigid substrate, wherein the flexible fingerprint component is formed on the rigid substrate, the flexible fingerprint component includes a flexible substrate, a photosensitive device layer and an optical film sequentially on the flexible substrate, a first chip-on film, on a first side of the optical film, bonded to the photosensitive device layer, and a second chip-on film, on a second side of the optical film, bonded to the photosensitive device layer, the optical film is provided with an extension portion beyond the flexible substrate, the second side of the optical film is on a side opposite to the extension portion, and the first side of the optical film is on a side adjacent to the extension portion; adsorbing and fixing the rigid substrate by using a first vacuum adsorption platform; clamping the extension portion by using a clamp; and adjusting, by using a control mechanism, an angle of a pulling force applied by the clamp to the extension portion to a peeling angle that is preset, and controlling the clamp to lift the extension portion at the peeling angle, so as to drive the flexible substrate to be peeled off from the rigid substrate according to a preset peeling speed.

Optionally, in the above peeling method provided by the embodiment of the present disclosure, the clamping the extension portion by using the clamp, and the adjusting, by using the control mechanism, the angle of the pulling force applied by the clamp to the extension portion to the peeling angle that is preset, and controlling the clamp to lift the extension portion at the peeling angle specifically include: clamping the extension portion by a first clamping plate and a second clamping plate, and after adjusting, by a first manipulator and a second manipulator, the first clamping plate and the second clamping plate to rotate to the peeling angle respectively through a first rotating shaft and a second rotating shaft, maintaining the peeling angle by the first manipulator and the second manipulator, and continuing to control the first clamping plate and the second clamping plate to lift the extension portion at the peeling angle in a pulling force mode.

Optionally, in the above peeling method provided by the embodiment of the present disclosure, the peeling angle is less than or equal to 30°, and a peeling speed is less than or equal to 5 mm/s.

Optionally, the above peeling method provided by the embodiment of the present disclosure further includes: performing, by an auxiliary peeling mechanism, auxiliary peeling on the first chip-on film in a peeling direction at the peeling speed when peeling the flexible fingerprint component to a bonding zone of the first chip-on film.

Optionally, in the above peeling method provided by the embodiment of the present disclosure, the performing, by the auxiliary peeling mechanism, auxiliary peeling on the first chip-on film in the peeling direction at the peeling speed specifically includes: pushing, by a driver, a rigid cushion block to perform auxiliary peeling on the first chip-on film in the peeling direction at the peeling speed.

Optionally, the above peeling method provided by the embodiment of the present disclosure, after providing the flexible fingerprint component formed on the rigid substrate and before adsorbing and fixing the rigid substrate by using the first vacuum adsorption platform, further includes: placing, by a first transmission mechanism, the rigid substrate bearing the flexible fingerprint component onto the first vacuum adsorption platform in an aligning mode.

Optionally, the above peeling method provided by the embodiment of the present disclosure, after peeling the flexible fingerprint component from the rigid substrate, further includes: placing, by a second transmission mechanism, the flexible fingerprint component on a second vacuum adsorption platform in an aligning mode, so as to adsorb and fix the flexible substrate through the second vacuum adsorption platform, a vacuum adsorption hole of the second vacuum adsorption platform being smaller than a vacuum adsorption hole of the first vacuum adsorption platform.

Optionally, the above peeling method provided by the embodiment of the present disclosure, after adsorbing and fixing the flexible substrate through the second vacuum adsorption platform, further includes: cutting off, by a cutting mechanism, the extension portion of the flexible fingerprint component on the second vacuum adsorption platform.

Optionally, the above peeling method provided by the embodiment of the present disclosure, after cutting off, by the cutting mechanism, the extension portion of the flexible fingerprint component on the second vacuum adsorption platform, further includes: attaching, by an attaching mechanism, a protecting film and a supporting film respectively to the flexible fingerprint component, wherein the protecting film is on a side of the optical film facing away from the photosensitive device layer, and the supporting film is on a side of the flexible substrate facing away from the photosensitive device layer.

Optionally, the above peeling system provided by the embodiment of the present disclosure further includes: blowing air to remove static electricity between the flexible substrate and the rigid substrate by using an ionizing air blower in a peeling process.

BRIEF DESCRIPTION OF FIGURES

FIG. 8 is a flow diagram of a peeling method provided by an embodiment of the present disclosure.

DETAILED DESCRIPTION

Figure 1:
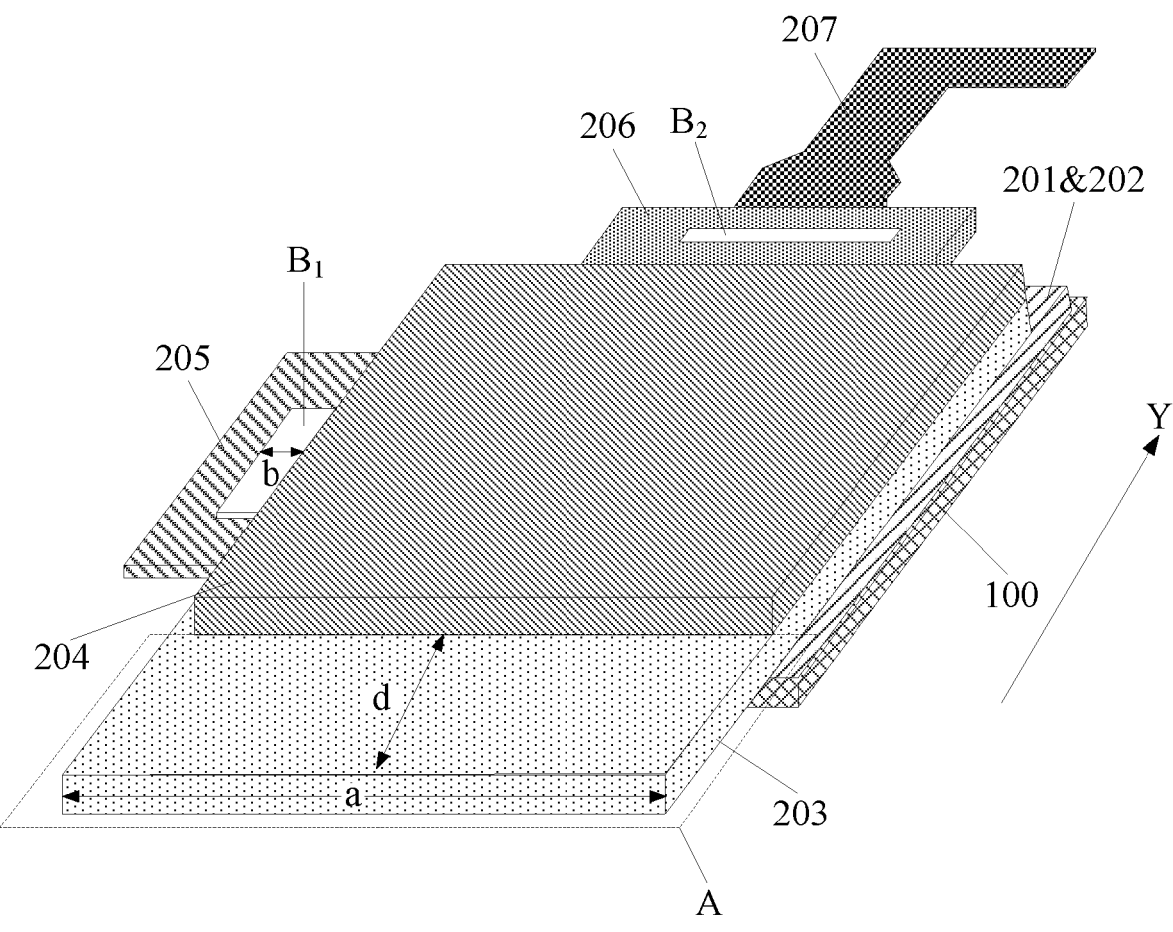
FIG. 1 is a schematic structural diagram of a to-be-peeled flexible fingerprint component provided by an embodiment of the present disclosure.
Figure 2:
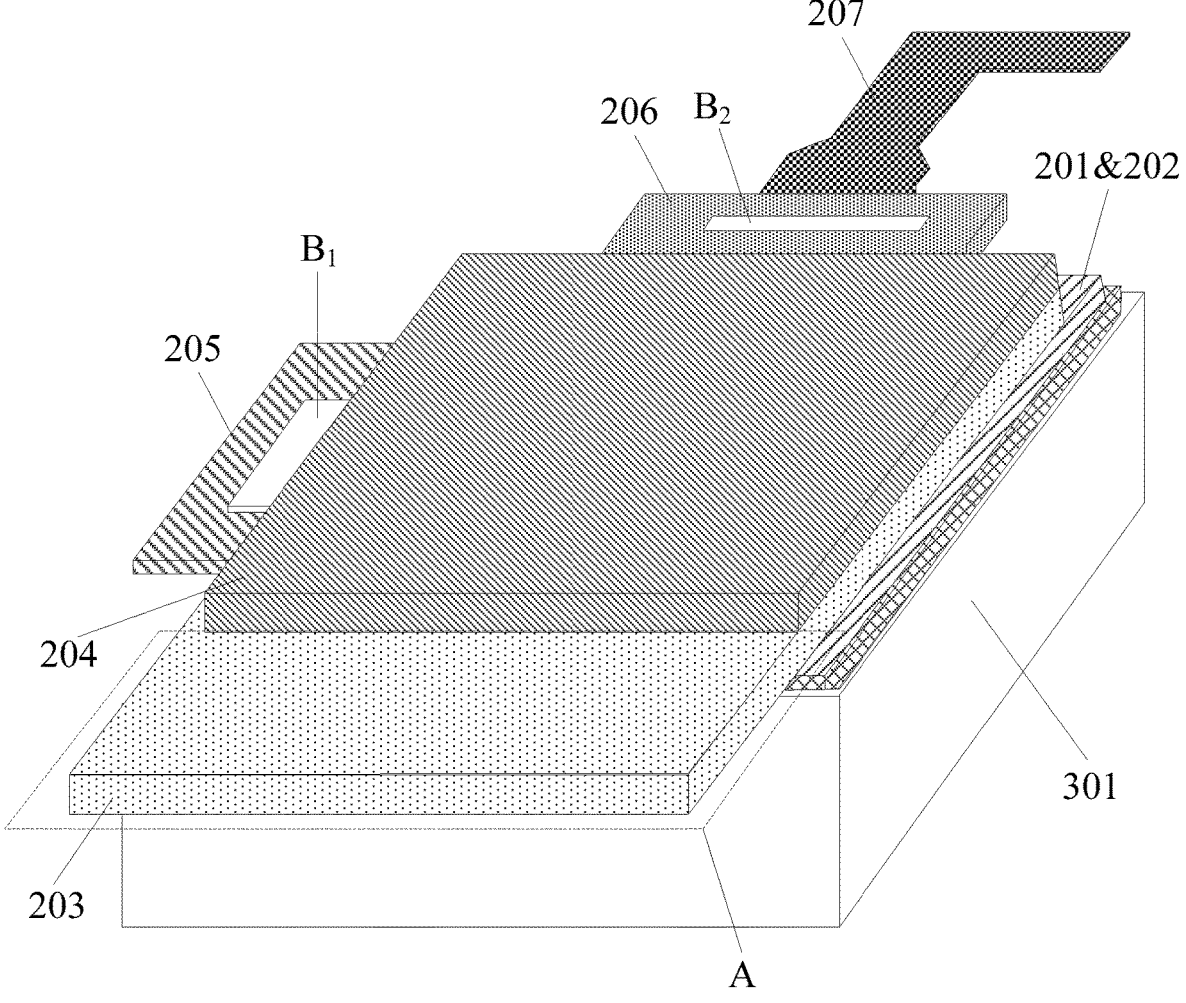
FIG. 2 is a schematic diagram of fixing the flexible fingerprint component shown in FIG. 1 onto a first vacuum adsorption platform provided by an embodiment of the present disclosure.

In order to make objectives, technical solutions and advantages of embodiments of the present disclosure clearer, the technical solutions of the embodiments of the present disclosure will be described below clearly and completely with reference to accompanying drawings of the embodiments of the present disclosure. It should be noted that sizes and shapes of all graphs in the accompanying drawings do not reflect the true scale, and only intend to illustrate the content of the present disclosure. The same or similar reference numbers represent the same or similar elements or elements with the same or similar functions from beginning to end. Apparently, the described embodiments are part of the embodiments of the present disclosure, not all of them. On the basis of the described embodiments of the present disclosure, all other embodiments obtained by those ordinarily skilled in the art without inventive efforts fall within the protection scope of the present disclosure.

Unless otherwise defined, the technical or scientific terms used here shall have the usual meanings understood by a person of ordinary skill in the art to which the present disclosure belongs. "First", "second" and similar words used in the specification and claims of the present disclosure do not indicate any order, quantity or importance, but are only used to distinguish different elements. "Including" or "containing" and similar words, mean that an element or item preceding the word covers an element or item listed after the word and the equivalent thereof, without excluding other elements or items. The words "inner", "outer", "up", "down" and the like are only used to indicate the relative positional relationship. When the absolute position of the described object changes, the relative positional relationship may also change accordingly.

A preparation process of a flexible electronic device is generally as follows: first, a flexible film material (such as polyimide PI) is prepared on a glass substrate, then different manufacturing processes are used on the flexible film material to make various electronic devices, then the flexible electronic device is peeled off from the glass substrate, and finally the flexible electronic device is bonded with (Bonding) a chip-on film through which a driving signal is provided for the flexible electronic device.

At present, the most commonly used mode for peeling the flexible electronic device from the glass substrate is laser lift-off (LLO). Specifically, laser is irradiated from a side of the glass substrate, to break a bonding bond at an interface between the glass substrate and the flexible film material, and the flexible electronic device is smoothly removed from the glass substrate. Laser lift-off has the advantage of high peeling speed, but also has several obvious defects: 1, stains on the glass substrate may affect transmission of laser, and before laser lift-off, it is necessary to add a process of cleaning the glass substrate; 2, after the interface between the flexible film material and the glass substrate is irradiated by the laser, carbides will be left, so it is necessary to add a process of cleaning a back face of the flexible film material; and 3, the laser needs to be fully absorbed by the flexible film material and not irradiated onto a pixel layer formed on the flexible film material to prevent damage to a device circuit, and therefore, it is necessary to regularly calibrate laser power.

It may be known from the above description that although the laser lift-off process is relatively mature, its equipment is expensive and the cost of regular maintenance is high. Therefore, the use of mechanical power for peeling has emerged. Compared to laser lift-off, mechanical peeling has low cost and simple process. The mechanical peeling technical solution in the related art is roller peeling. A roller is used to roll and peel the flexible electronic device from the glass substrate, then the flexible electronic device is flattened, and the flattened flexible electronic device is bonded with a chip-on film (COF). However, the flexible electronic device may be bent in a bonding process, and a flexible bonding process is more complex than a rigid bonding process. Therefore, how to reduce bonding difficulty and reduce a deformation risk of the flexible electronic device is a technical problem urgently needing to be solved by those skilled in the art.

In order to at least solve the above technical problem existing in the related art, an embodiment of the present disclosure provides a peeling system for a flexible fingerprint component. As shown in FIG. 1 to FIG. 6, the flexible fingerprint component is formed on a rigid substrate 100, the flexible fingerprint component includes a flexible substrate 201, a photosensitive device layer 202 and an optical film 203&204 sequentially arranged on the flexible substrate, a first chip-on film 205, bonded to the photosensitive device layer 202, on a first side of the optical film 203&204, and a second chip-on film 206, bonded to the photosensitive device layer 202, on a second side of the optical film 203&204, the optical film 203&204 is provided with an extension portion A beyond the flexible substrate 201, the second side of the optical film 203&204 is located on a side opposite to the extension portion A, and the first side of the optical film 203&204 is located on a side adjacent to the extension portion A.

The peeling system includes: a first vacuum adsorption platform 301, configured to adsorb and fix the rigid substrate 100; a clamp 302, configured to clamp the extension portion A; a control mechanism 303, configured to adjust an angle of a pulling force applied by the clamp 302 to the extension portion A to a peeling angle that is preset, and control the clamp 302 to lift the extension portion A at the peeling angle, so as to drive the flexible substrate 201 to be peeled off from the rigid substrate 100 according to a preset peeling speed.

In the above peeling system provided by the present disclosure, before peeling off the flexible fingerprint component from the rigid substrate 100, the photosensitive device layer 202 is bonded with the first chip-on film 205 and the second chip-on film 206. Due to a supporting effect of the rigid substrate 100, the photosensitive device layer 202 is not prone to deforming in a bonding process. In addition, in the present disclosure, the extension portion A of the optical film 203&204 attached to the photosensitive device layer 202 beyond the flexible substrate 201 is taken as a pulling force grip, and the flexible substrate 201 is peeled from the rigid substrate 100 at the peeling angle and the peeling speed that are preset by using the clamp and the control mechanism 203, thereby effectively avoiding technical problems such as fracture of each film layer of the fingerprint recognition component, device failure, or irreversible deformation of the flexible substrate 201, and increasing a product yield.

It should be noted that in the present disclosure, the optical film 203&204 attached to the photosensitive device layer 202 may specifically include an infrared cutoff film 203 and a collimation film 204, wherein the infrared cutoff film 203 may filter red light transmitted by ambient light to the photosensitive device layer 202 through fingers, and the collimation film 204 may converge light signals reflected by fingerprints into a collimating hole, avoiding cross talk of reflected light from finger valleys and ridges. In order to save materials and avoid force deformation of the collimating hole, only the infrared cutoff film 203 may be extended. In some embodiments, to facilitate grasping, a length d of the extension portion A may be in a range of 3 mm to 20 mm.

Figure 5:
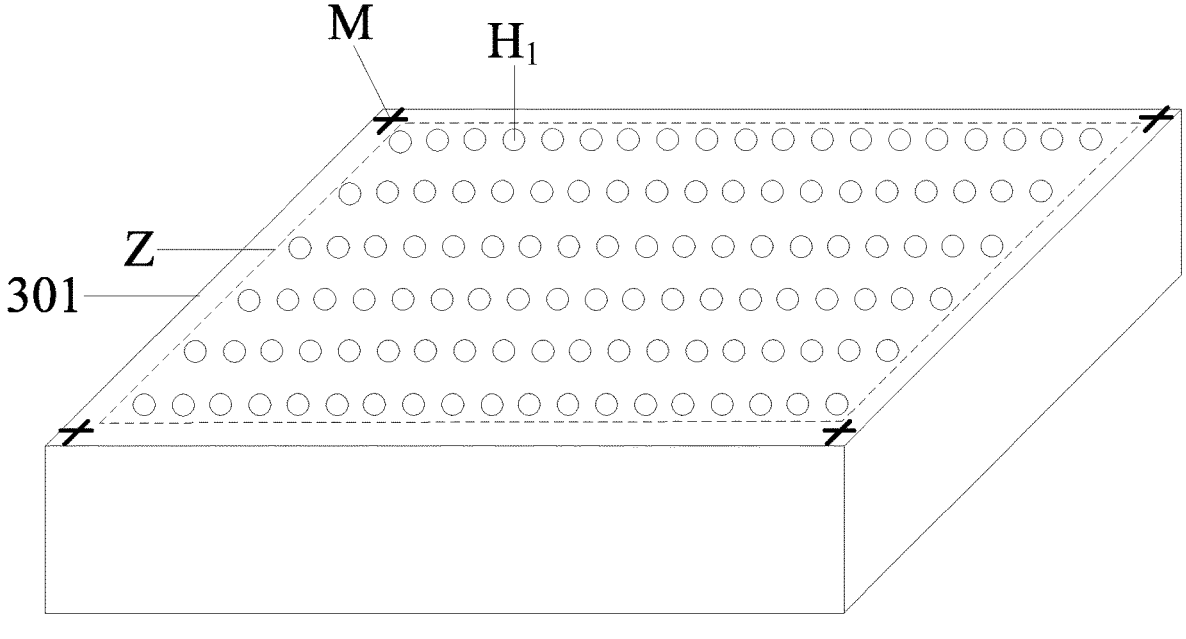
FIG. 5 is a schematic structural diagram of a first vacuum adsorption platform provided by an embodiment of the present disclosure.

In some embodiments, as shown in FIG. 5, in order to prevent the extension portion A from being adsorbed on the first vacuum adsorption platform 301, it is necessary to ensure that a zone Z of a vacuum adsorption hole $H_1$ of the first vacuum adsorption platform 301 is slightly smaller than an area of the rigid substrate 100. Exemplarily, a distance between a boundary of the zone Z of the vacuum adsorption hole $H_1$ and a boundary of the first vacuum adsorption platform 301 may be in a range of 1 mm to 1.5 mm.

Moreover, it should be understood that a vacuum adsorption force of the first vacuum adsorption platform 301 should be greater than a peeling force to prevent the flexible fingerprint component from sliding off the first vacuum adsorption platform 301.

In addition, the photosensitive device layer 202 may include a photosensitive device, a source line electrically connected to the photosensitive device, a detection pixel circuit electrically connected to the photosensitive device, and a gate line electrically connected to the detection pixel circuit. The photosensitive device may include a bottom electrode and a top electrode oppositely arranged, and a photosensitive structure located between the bottom electrode and the top electrode. Optionally, the photosensitive structure may include a P-type semiconductor layer, an intrinsic semiconductor layer, and an N-type semiconductor layer. The detection pixel circuit may include a transistor and a capacitor. The gate line may be electrically connected to the first chip-on film 205, and the source line may be electrically connected to the second chip-on film 206. In some embodiments, the first chip-on film 205 may provide a signal of a gate driving chip (Gate IC) to the gate line, and the second chip-on film 206 may provide a signal of the source line to a reading chip 207 (ROIC).

Figure 3:
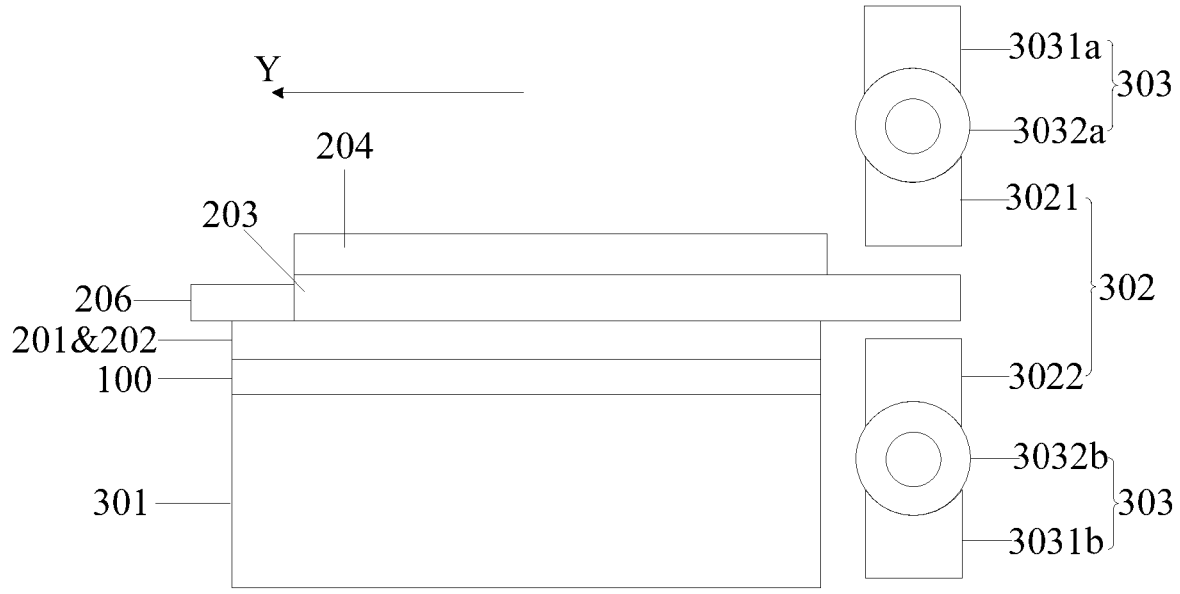
FIG. 3 is a schematic diagram of a peeling system before peeling provided by an embodiment of the present disclosure.
Figure 4:
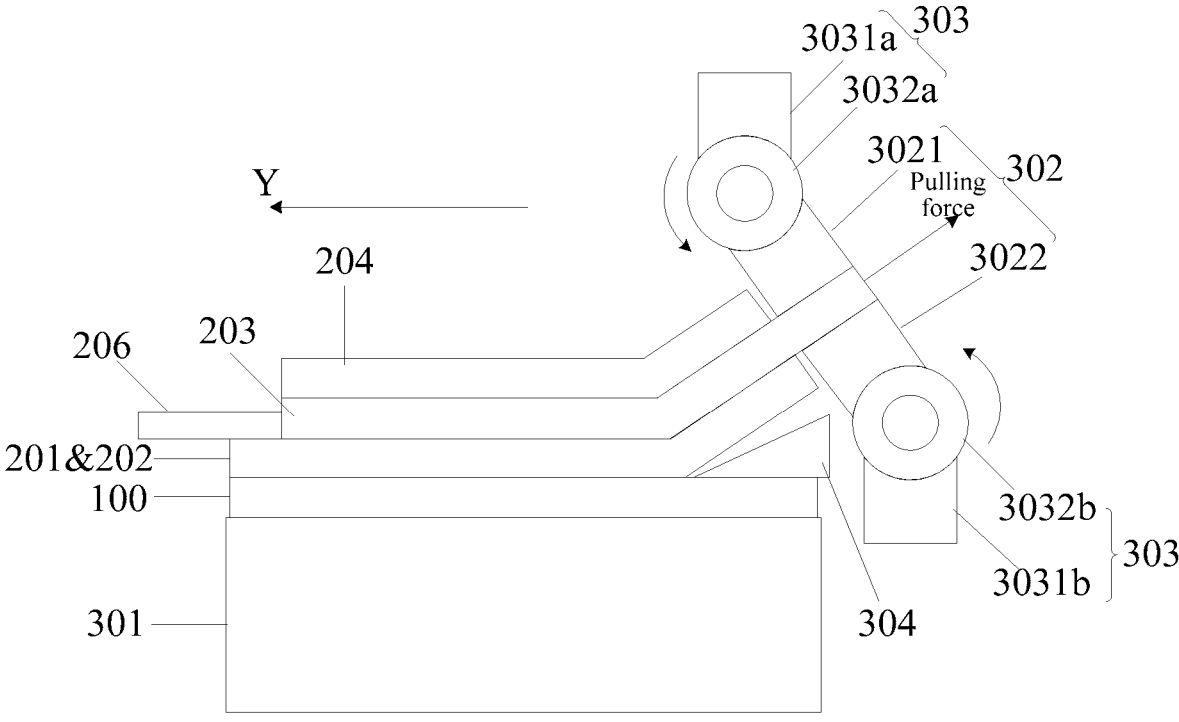
FIG. 4 is a schematic diagram of a peeling system in a peeling process provided by an embodiment of the present disclosure.
Figure 6:
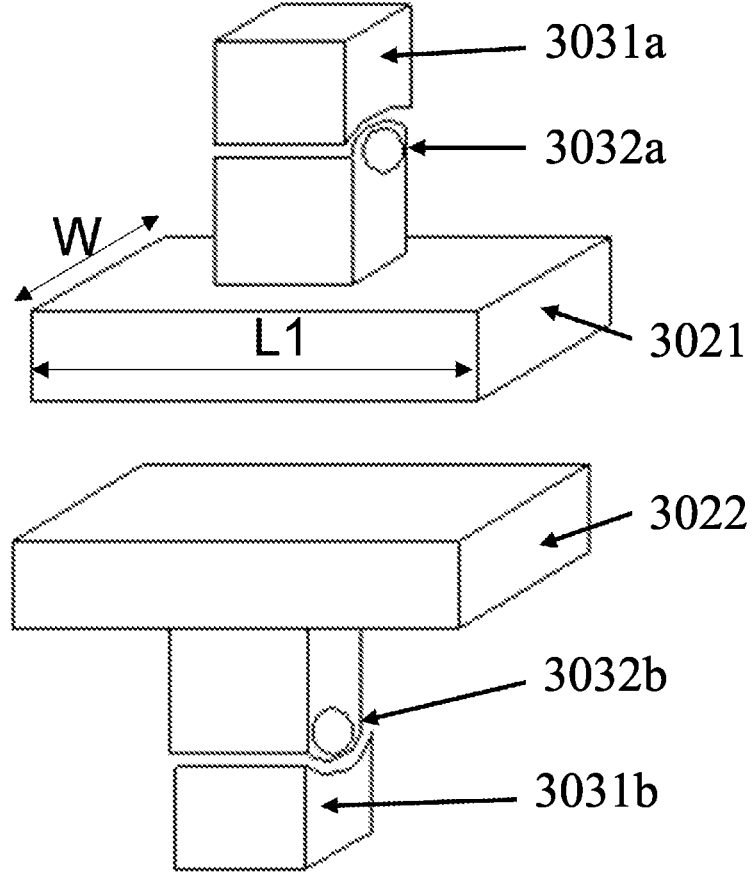
FIG. 6 is a schematic structural diagram of a clamp and a control mechanism provided by an embodiment of the present disclosure.

Optionally, in the above peeling system provided by the embodiment of the present disclosure, as shown in FIG. 3, FIG. 4, and FIG. 6, the clamp 302 may include a first clamping plate 3021 and a second clamping plate 3022, and the control mechanism 303 may include a first manipulator 3031*a*, a second manipulator 3031*b*, a first rotating shaft 3032*a* and a second rotating shaft 3032*b*, wherein the first clamping plate 3021 is connected with the first manipulator 3031*a* through the first rotating shaft 3032*a*, and the second clamping plate 3022 is connected with the second manipulator 3031*b* through the second rotating shaft 3032*b*.

During specific implementation, as shown in FIG. 4, after the first clamping plate 3021 and the second clamping plate 3022 clamp the extension portion A, the first manipulator 3031*a* drives the first clamping plate 3021 to rotate counterclockwise through the first rotating shaft 3032*a*, while the second manipulator 3031*b* drives the second clamping plate 3022 to rotate counterclockwise through the second rotating shaft 3032*b*, thereby generating the pulling force. A direction of the pulling force is a direction of the peeling angle. Afterwards, the first manipulator 3031*a* and the second manipulator 3031*b* maintain the peeling angle according to a set action trajectory, and continue to control the first clamping plate 3021 and the second clamping plate 3022 to lift the extension portion A at the peeling angle in a pulling force mode until the complete peeling for the flexible fingerprint component is completed in a peeling direction Y.

It should be noted that the first manipulator 3031*a* and the second manipulator 3031*b* may be externally connected to an automatic control system, and motion trajectories of the first manipulator 3031*a* and the second manipulator 3031*b* are controlled through the automatic system, so as to freely adjust spatial positions of the first clamping plate 3021 and the second clamping plate 3022, and change the peeling angle through the first rotating shaft 3032*a* and the second rotating shaft 3032*b*.

Furthermore, it should be understood that an adhesion force between the infrared cutoff film 203 and the photosensitive device layer 202 must be greater than an adhesion force between the flexible substrate 201 and the rigid substrate 100. Otherwise, the infrared cutoff film 203 will be directly peeled from a surface of the photosensitive device layer 202 and cannot carry the flexible substrate 201.

Optionally, in the above peeling system provided by the embodiment of the present disclosure, in order to improve the firmness of clamping, sizes of the first clamping plate 3021 and the second clamping plate 3022 may be set to be both substantially the same as a size of the extension portion A. Specifically, as shown in FIG. 1 and FIG. 6, lengths L1 of the first clamping plate 3021 and the second clamping plate 3022 are substantially the same as a transverse length a of the extension portion A, and widths W of the first clamping plate 3021 and the second clamping plate 3022 are substantially the same as an extension length d of the extension portion A.

It should be noted that in the embodiments provided by the present disclosure, due to influences of limitation in a process condition or other factors such as measurement, the above "substantially" may be completely equivalent or there may be some deviations. Therefore, as long as a "substantially" relationship between the above features meets an allowable error (such as a 10% fluctuation), it belongs to a protection scope of the present disclosure.

Figure 7:
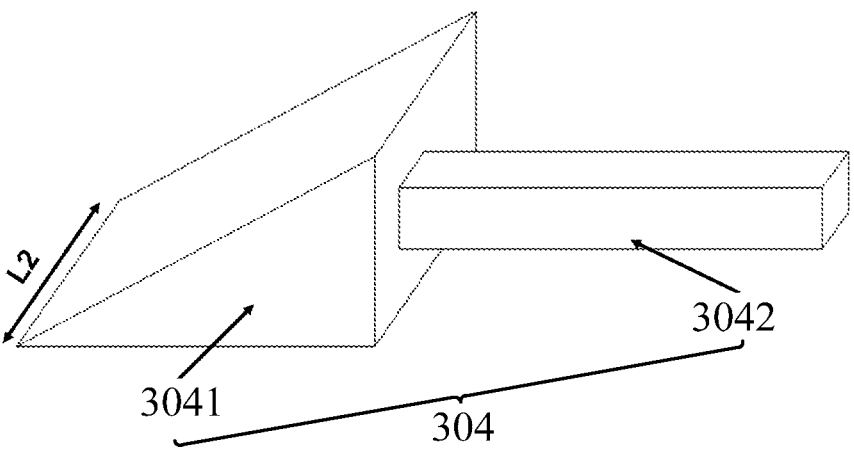
FIG. 7 is a schematic structural diagram of an auxiliary peeling mechanism provided by an embodiment of the present disclosure.

Optionally, the above peeling method provided by the embodiment of the present disclosure, as shown in FIG. 4 and FIG. 7, may further include: an auxiliary peeling mechanism 304, configured to perform auxiliary peeling on the first chip-on film 305 in the peeling direction Y at the peeling speed when peeling the flexible fingerprint component to a bonding zone of the first chip-on film 305.

Due to bonding of a first chip-on film 205 extending in the peeling direction Y and a second chip-on film 206 extending in a direction perpendicular to the peeling direction Y at an edge of the flexible substrate 201, curing of anisotropic conductive adhesive (ACF adhesive) used in a bonding process will cause the flexible substrate 201 in the bonding zone to be harder, stiffer, and less prone to bending. Moreover, due to a larger length of the bonding zone B 1 (as shown in FIG. 1) of the first chip-on film 205 in the peeling direction Y, it is more prone to bending in the peeling process. Therefore, when peeling to the bonding zone B 1 of the first chip-on film 205, the auxiliary peeling mechanism 304 needs to be added for auxiliary peeling to ensure that there is no deformation at a junction of a softer non-bonding zone and the harder bonding zone, and to avoid technical problems such as film layer fracture and device failure.

It should be noted that due to a smaller length of the bonding zone $B_2$ of the second chip-on film 206 in the peeling direction Y and the attention paid to preventing adhesive overflow in the bonding process, the hardness of the flexible substrate 201 in the bonding zone $B_2$ of the first chip-on film 205 is almost not affected. Therefore, the peeling process of the flexible substrate 201 in the bonding zone $B_2$ of the first chip-on film 205 does not require auxiliary peeling.

Optionally, in the above peeling system provided by the embodiment of the present disclosure, as shown in FIG. 6, the auxiliary peeling mechanism 304 may include: a rigid cushion block 3041 and a driver 3042 connected with the rigid cushion block 3041. The driver 3042 may provide power for the rigid cushion block 3041, to enable the rigid cushion block 3041 to move in the peeling direction Y at a moving speed consistent with the peeling speed. After peeling is completed, the auxiliary peeling mechanism 304 will automatically return to a starting position. In some embodiments, the auxiliary peeling mechanism 304 may be externally connected to the automatic control system, and through the automatic control system, the auxiliary peeling mechanism 304 is controlled to advance in the peeling direction Y to execute the auxiliary peeling motion, or to retreat to the starting position.

Optionally, in the above peeling system provided by the embodiment of the present disclosure, as shown in FIG. 6, in order to achieve a good auxiliary peeling effect, the rigid cushion block 3041 may be a wedge-shaped cushion block, an included angle between the wedge-shaped cushion block and the rigid substrate 100 is less than the peeling angle, and a length L2 of a side parallel to the rigid substrate 100 in a surface contained by the wedge-shaped cushion block 3041 and forming the included angle with the rigid substrate 100 is equal to a bonding width b of the first chip-on film 205 perpendicular to the peeling direction Y (as shown in FIG. 1).

Optionally, the above peeling system provided by the embodiment of the present disclosure may further include: a first transmission mechanism, configured to place the rigid substrate 100 bearing the flexible fingerprint component onto the first vacuum adsorption platform 301 in an aligning mode. In some embodiments, the first vacuum adsorption platform 301 may have alignment marks M located at four corners, and the first transmission mechanism may precisely align with the alignment marks M, thereby precisely placing the rigid substrate 100 bearing the flexible fingerprint component in the zone Z of the vacuum adsorption hole $H_1$.

Optionally, the above peeling system provided by the embodiment of the present disclosure may further include: a second transmission mechanism and a second vacuum adsorption platform, the second transmission mechanism is configured to place the flexible fingerprint component on the second vacuum adsorption platform in an aligning mode, so as to adsorb and fix the flexible substrate through the second vacuum adsorption platform; and a vacuum adsorption hole of the second vacuum adsorption platform is smaller than a vacuum adsorption hole of the first vacuum adsorption platform. In other words, after peeling is completed, the second transmission mechanism transfers the flexible fingerprint component onto the second vacuum adsorption platform. At this moment, the flexible fingerprint component is relatively soft due to no support for a lower portion of the flexible fingerprint component. If an aperture of the vacuum adsorption hole of the second vacuum adsorption platform is large, it will cause deformation of the flexible fingerprint component and damage to the device. Therefore, the vacuum adsorption hole of the second vacuum adsorption platform needs to be smaller than the vacuum adsorption hole of the first vacuum adsorption platform. Optionally, the aperture of the vacuum adsorption hole of the second vacuum adsorption platform should be less than 100 μm. In addition, four corners of the second vacuum adsorption platform also have alignment marks, and since there is no need to clamp the extension portion A in the future, a zone of the vacuum adsorption hole of the second vacuum adsorption platform may be greater than, equal to, or smaller than the area of the flexible substrate 201.

Optionally, in the above peeling system provided by the embodiment of the present disclosure, the first transmission mechanism and the second transmission mechanism may be each a transmission belt or a manipulator. Certainly, the first transmission mechanism and the second transmission mechanism may further be other elements with a handling function that are well-known to those skilled in the art, which is not specifically limited here.

Optionally, the above peeling system provided by the embodiment of the present disclosure may further include: a cutting mechanism, configured to cut off the extension portion A of the flexible fingerprint component on the second vacuum adsorption platform. A cutting mode may be knife wheel cutting or laser cutting. During knife wheel cutting, it needs to pay attention to not to cause deformation to the flexible fingerprint component, and a knife wheel needs to be kept in a sharp state and replaced regularly. During laser cutting, it needs to pay attention to not to burn the flexible substrate 201 and the optical film 203&204.

Optionally, the above peeling system provided by the embodiment of the present disclosure may further include: an attaching mechanism, configured to attach a protecting film and a supporting film respectively to the flexible fingerprint component the extension portion of which is cut off, wherein the protecting film is located on a side of the optical film 203&204 facing away from the photosensitive device layer 202, the supporting film is located on a side of the flexible substrate 201 facing away from the photosensitive device layer 202, and sizes of the protecting film and the supporting film are both substantially the same as a size of the flexible substrate 201. Specifically, after the extension portion A is cut off, the protecting film is attached to a side of the optical film 203&204 contained in the flexible fingerprint component, then a vacuum state is removed, the flexible fingerprint component is flipped, and the supporting film is attached to a side of the flexible substrate 201.

Optionally, the above peeling system provided by the embodiment of the present disclosure may further include an ionizing air blower, configured to blow air to remove static electricity between the flexible substrate 201 and the rigid substrate 100 in a peeling process, so as to effectively prevent electrostatic breakdown of the device circuit in the peeling process.

Based on the same inventive concept, an embodiment of the present disclosure provides a peeling method for a flexible fingerprint component. Principles of the peeling method for solving the problems are similar to those of the above peeling system, therefore, implementation of the peeling method provided by the embodiment of the present disclosure may refer to that of the above peeling system provided by the embodiment of the present disclosure, and repetitions are omitted.

Specifically, the peeling method for the flexible fingerprint component provided by the embodiment of the present disclosure, as shown in FIG. 8, may include the following.

S801, a flexible fingerprint component formed on a rigid substrate is provided, wherein the flexible fingerprint component is formed on the rigid substrate, the flexible fingerprint component includes a flexible substrate, a photosensitive device layer and an optical film sequentially arranged on the flexible substrate, a first chip-on film bonded to the photosensitive device layer on a first side of the optical film, and a second chip-on film bonded to the photosensitive device layer on a second side of the optical film, the optical film is provided with an extension portion beyond the flexible substrate, the second side of the optical film is located on a side opposite to the extension portion, and the first side of the optical film is located on a side adjacent to the extension portion.

S802, the rigid substrate is adsorbed and fixed by using a first vacuum adsorption platform.

S803, an extension portion is clamped by using a clamp.

S804, an angle of a pulling force applied by the clamp to the extension portion is adjusted to a peeling angle that is preset by using a control mechanism, and the clamp is controlled to lift the extension portion at a peeling angle, so as to drive a flexible substrate to be peeled off from the rigid substrate according to a preset peeling speed.

Optionally, in the above peeling method provided by the embodiment of the present disclosure, the step S803 of clamping the extension portion, and the step S804 of adjusting, by using the control mechanism, the angle of the pulling force applied by the clamp to the extension portion to the peeling angle that is preset, and controlling the clamp to lift the extension portion at the peeling angle may specifically be implemented in the following modes: a first clamping plate and a second clamping plate clamp the extension portion, and after a first manipulator and a second manipulator adjust the first clamping plate and the second clamping plate to rotate to the peeling angle respectively through a first rotating shaft and a second rotating shaft, the first manipulator and the second manipulator maintain the peeling angle, and continue to control the first clamping plate and the second clamping plate to lift the extension portion at the peeling angle in a pulling force mode.

The setting of the peeling angle and the peeling speed needs to consider factors such as a bending strength of the photosensitive device layer 202, a tensile strength of the flexible substrate 201, an adhesion force between the flexible substrate 201 and the rigid substrate 100, and a stiffness of the optical film 203&204. When the peeling angle increases, a component force in a vertical direction increases, which is more conducive to peeling-off of the flexible substrate 201 from the rigid substrate 100. However, an inorganic layer in the photosensitive device layer 202 will be broken due to bending, and because a bonding zone is large in hardness and is not prone to bending, there will be significant deformation at a junction with a soft non-bonding zone, leading to circuit damage and the functional failure of the first chip-on film 205. When the peeling speed increases, the tensile force borne by the flexible substrate 201 also increases, which may cause irreversible deformation of the flexible substrate 201 and damage to the photosensitive device layer 202. Therefore, the peeling speed and the peeling angle need to take factors such as a peeling force of the flexible substrate 201, a strength of the photosensitive device layer 202, a deformation limit of the flexible substrate 201, and a factory production capacity into account. In the present disclosure, the peeling angle may be less than or equal to 30°, and the peeling speed may be less than or equal to 5 mm/s.

Optionally, in the above peeling method provided by the embodiment of the present disclosure, an auxiliary peeling mechanism may further be added when peeling the flexible fingerprint component to the bonding zone of the first chip-on film, and the auxiliary peeling mechanism may perform auxiliary peeling on the first chip-on film in a peeling direction Y at the peeling speed.

Optionally, in the above peeling method provided by the embodiment of the present disclosure, the performing, by the auxiliary peeling mechanism, auxiliary peeling on the first chip-on film in the peeling direction at the peeling speed may specifically be implemented through following steps: a driver pushes a rigid cushion block to perform auxiliary peeling on the first chip-on film in the peeling direction at the peeling speed.

Optionally, in the above peeling method provided by the embodiment of the present disclosure, after executing the step S801 of providing the flexible fingerprint component formed on the rigid substrate and before executing the step S802 of adsorbing and fixing the rigid substrate by using the first vacuum adsorption platform, the following step may further be executed: a first transmission mechanism places the rigid substrate bearing the flexible fingerprint component onto the first vacuum adsorption platform in an aligning mode.

Optionally, in the above peeling method provided by the embodiment of the present disclosure, after peeling the flexible fingerprint component from the rigid substrate, the following step may further be executed: a second transmission mechanism places the flexible fingerprint component on a second vacuum adsorption platform in an aligning mode, so as to adsorb and fix the flexible substrate through the second vacuum adsorption platform, a vacuum adsorption hole of the second vacuum adsorption platform being smaller than a vacuum adsorption hole of the first vacuum adsorption platform.

Optionally, in the above peeling method provided by the embodiment of the present disclosure, after adsorbing and fixing the flexible substrate through the second vacuum adsorption platform, the following step may further be executed: a cutting mechanism cuts off the extension portion of the flexible fingerprint component on the second vacuum adsorption platform.

Optionally, in the above peeling method provided by the embodiment of the present disclosure, after cutting off, by the cutting mechanism, the extension portion of the flexible fingerprint component on the second vacuum adsorption platform, the following step may further be executed: an attaching mechanism attaches a protecting film and a supporting film respectively to the flexible fingerprint component, wherein the protecting film is located on a side of the optical film facing away from the photosensitive device layer, and the supporting film is located on a side of the flexible substrate facing away from the photosensitive device layer.

Optionally, in the above peeling system provided by the embodiment of the present disclosure, the following step may further be executed: air is blown to remove static electricity between the flexible substrate and the rigid substrate by using an ionizing air blower in a peeling process.

Although the preferred embodiments of the present disclosure have been described, those skilled in the art can make additional modifications and variations on these embodiments once they know the basic creative concept. Therefore, the appended claims intend to be explained as including the preferred embodiments and all modifications and variations falling within the scope of the present disclosure.

Apparently, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent art, the present disclosure also intends to include these modifications and variations.

What is claimed is:

1. A peeling system for a flexible fingerprint component, wherein the flexible fingerprint component is formed on a rigid substrate, the flexible fingerprint component comprises a flexible substrate, a photosensitive device layer and an optical film sequentially on the flexible substrate, a first chip-on film, on a first side of the optical film, bonded to the photosensitive device layer, and a second chip-on film, on a second side of the optical film, bonded to the photosensitive device layer; wherein the optical film is provided with an extension portion beyond the flexible substrate, the second side of the optical film is on a side opposite to the extension portion, and the first side of the optical film is on a side adjacent to the extension portion; and the peeling system comprises:

a first vacuum adsorption platform, configured to adsorb and fix the rigid substrate;

a clamp, configured to clamp the extension portion; and a control mechanism, configured to adjust an angle of a pulling force applied by the clamp to the extension portion to a peeling angle that is preset, and control the clamp to lift the extension portion at the peeling angle, so as to drive the flexible substrate to be peeled off from the rigid substrate according to a preset peeling speed;

wherein the clamp comprises a first clamping plate and a second clamping plate, the control mechanism comprises a first rotating shaft, a second rotating shaft, a first manipulator and a second manipulator, the first clamping plate is connected with the first manipulator through the first rotating shaft, and the second clamping plate is connected with the second manipulator through the second rotating shaft.

2. The peeling system according to claim 1, further comprising: an auxiliary peeling mechanism, wherein the auxiliary peeling mechanism is configured to perform auxiliary peeling on the first chip-on film in a peeling direction at the peeling speed when peeling the flexible fingerprint component to a bonding zone of the first chip-on film.

3. The peeling system according to claim 1, further comprising: a first transmission mechanism, configured to place the rigid substrate bearing the flexible fingerprint component onto the first vacuum adsorption platform in an aligning mode.

4. The peeling system according to claim 3, further comprising: a second transmission mechanism and a second vacuum adsorption platform, wherein the second transmission mechanism is configured to place the flexible fingerprint component on the second vacuum adsorption platform in an aligning mode, so as to adsorb and fix the flexible substrate through the second vacuum adsorption platform; and a vacuum adsorption hole of the second vacuum adsorption platform is smaller than a vacuum adsorption hole of the first vacuum adsorption platform.

5. The peeling system according to claim 4, further comprising: a cutting mechanism, configured to cut off the extension portion of the flexible fingerprint component on the second vacuum adsorption platform.

6. The peeling system according to claim 1, further comprising an ionizing air blower, configured to blow air to remove static electricity between the flexible substrate and the rigid substrate in a peeling process.

7. A peeling method for a flexible fingerprint component, comprising:

providing a flexible fingerprint component formed on a rigid substrate, wherein the flexible fingerprint component is formed on the rigid substrate, the flexible fingerprint component comprises a flexible substrate, a photosensitive device layer and an optical film sequentially on the flexible substrate, a first chip-on film, on a first side of the optical film, bonded to the photosensitive device layer, and a second chip-on film, on a second side of the optical film, bonded to the photosensitive device layer, the optical film is provided with an extension portion beyond the flexible substrate, the second side of the optical film is on a side opposite to the extension portion, and the first side of the optical film is on a side adjacent to the extension portion;

adsorbing and fixing the rigid substrate by using a first vacuum adsorption platform;

clamping the extension portion by using a clamp; and adjusting, by using a control mechanism, an angle of a pulling force applied by the clamp to the extension portion to a peeling angle that is preset, and controlling the clamp to lift the extension portion at the peeling angle, so as to drive the flexible substrate to be peeled off from the rigid substrate according to a preset peeling speed;

wherein the clamping the extension portion by using the clamp, and the adjusting, by using the control mechanism, the angle of the pulling force applied by the clamp to the extension portion to the peeling angle that is preset, and controlling the clamp to lift the extension portion at the peeling angle specifically comprise:

clamping the extension portion by a first clamping plate and a second clamping plate, and after adjusting, by a first manipulator and a second manipulator, the first clamping plate and the second clamping plate to rotate to the peeling angle respectively through a first rotating shaft and a second rotating shaft, maintaining the peeling angle by the first manipulator and the second manipulator, and continuing to control the first clamping plate and the second clamping plate to lift the extension portion at the peeling angle in a pulling force mode.

8. The peeling method according to claim 7, wherein the peeling angle is less than or equal to 30°, and a peeling speed is less than or equal to 5 mm/s.

9. The peeling method according to claim 7, further comprising: performing, by an auxiliary peeling mechanism, auxiliary peeling on the first chip-on film in a peeling direction at the peeling speed when peeling the flexible fingerprint component to a bonding zone of the first chip-on film.

10. The peeling method according to claim 7, after providing the flexible fingerprint component formed on the rigid substrate and before adsorbing and fixing the rigid substrate by using the first vacuum adsorption platform, further comprising:

placing, by a first transmission mechanism, the rigid substrate bearing the flexible fingerprint component onto the first vacuum adsorption platform in an aligning mode.

11. The peeling method according to claim 10, after peeling the flexible fingerprint component from the rigid substrate, further comprising:

placing, by a second transmission mechanism, the flexible fingerprint component on a second vacuum adsorption platform in an aligning mode, so as to adsorb and fix the flexible substrate through the second vacuum adsorption platform, a vacuum adsorption hole of the second vacuum adsorption platform being smaller than a vacuum adsorption hole of the first vacuum adsorption platform.

12. The peeling method according to claim 11, after adsorbing and fixing the flexible substrate through the second vacuum adsorption platform, further comprising:

cutting off, by a cutting mechanism, the extension portion of the flexible fingerprint component on the second vacuum adsorption platform.

* * * * *